(12) United States Patent
Dally et al.

(10) Patent No.: US 9,147,447 B2
(45) Date of Patent: Sep. 29, 2015

(54) GROUND-REFERENCED SINGLE-ENDED MEMORY INTERCONNECT

(71) Applicant: NVIDIA Corporation, Santa Clara, CA (US)

(72) Inventors: William J. Dally, Los Altos Hills, CA (US); Brucek Kurdo Khailany, San Francisco, CA (US); Thomas Hastings Greer, III, Chapel Hill, NC (US); John W. Poulton, Chapel Hill, NC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/844,570

(22) Filed: Mar. 15, 2013

(65) Prior Publication Data

US 2014/0268976 A1 Sep. 18, 2014

(51) Int. Cl.
*G11C 11/40* (2006.01)
*G11C 7/10* (2006.01)

(52) U.S. Cl.
CPC ............ *G11C 7/1057* (2013.01); *G11C 7/1069* (2013.01)

(58) Field of Classification Search
CPC ...................................................... G11C 11/40
USPC ..................................................... 365/189.18
See application file for complete search history.

(56) References Cited

U.S. PATENT DOCUMENTS

| | | |
|---|---|---|
| 6,125,047 A | 9/2000 | Janz |
| 7,962,115 B2 | 6/2011 | Huang et al. |
| 8,102,157 B2 | 1/2012 | Abe |
| 8,395,410 B2 | 3/2013 | Hatori |
| 8,538,558 B1 | 9/2013 | Sabapathy et al. |
| 8,583,953 B2 | 11/2013 | Sultenfuss |
| 8,611,437 B2 | 12/2013 | Poulton et al. |
| 8,621,131 B2 | 12/2013 | Loh et al. |
| 8,710,920 B2 | 4/2014 | Huang |
| 8,854,123 B1 | 10/2014 | Dally et al. |
| 2002/0104035 A1 | 8/2002 | Burns et al. |
| 2003/0185067 A1 | 10/2003 | Dellow |

(Continued)

FOREIGN PATENT DOCUMENTS

| | | |
|---|---|---|
| CN | 1324514 A | 11/2001 |
| CN | 1647381 | 7/2005 |

OTHER PUBLICATIONS

Poulton, J. W. et al., "A 0.54pJ/b 20Gb/s Ground-Referenced Single-Ended Short-Haul Serial Link in 28nm CMOS for Advanced Packaging Applications," 2013 IEEE International Solid-State Circuits Conference, Feb. 17-21, 2013, pp. 404-405.

(Continued)

*Primary Examiner* — Amir Zarabian
*Assistant Examiner* — Min Huang
(74) *Attorney, Agent, or Firm* — Zilka-Kotab, PC

(57) ABSTRACT

A system is provided for transmitting signals. The system comprises a first processing unit, a memory subsystem, and a package. The first processing unit is configured to include a first ground-referenced single-ended signaling (GRS) interface circuit. The memory subsystem is configured to include a second GRS interface circuit. The package is configured to include one or more electrical traces that couple the first GRS interface to the second GRS interface, where the first GRS interface circuit and the second GRS interface circuit are each configured to transmit a pulse along one trace of the one or more electrical traces by discharging a capacitor between the one trace and a ground network.

20 Claims, 15 Drawing Sheets

(56) References Cited

U.S. PATENT DOCUMENTS

| | | | |
|---|---|---|---|
| 2003/0208668 A1* | 11/2003 | To et al. ................... 711/200 |
| 2004/0114650 A1 | 6/2004 | Tanaka et al. |
| 2005/0207234 A1 | 9/2005 | Baechtold et al. |
| 2006/0232311 A1 | 10/2006 | Kitayama |
| 2007/0159488 A1 | 7/2007 | Danskin et al. |
| 2007/0210835 A1 | 9/2007 | Aghtar |
| 2007/0211711 A1 | 9/2007 | Clayton |
| 2008/0189457 A1 | 8/2008 | Dreps et al. |
| 2008/0212347 A1 | 9/2008 | Mok et al. |
| 2008/0311702 A1 | 12/2008 | Wark |
| 2009/0002066 A1 | 1/2009 | Lee et al. |
| 2009/0031078 A1* | 1/2009 | Warnes et al. .............. 711/105 |
| 2009/0189681 A1 | 7/2009 | Ivanov et al. |
| 2010/0046266 A1 | 2/2010 | Bruennert et al. |
| 2010/0202202 A1* | 8/2010 | Roohparvar ............ 365/185.08 |
| 2010/0220541 A1 | 9/2010 | Gebara et al. |
| 2011/0128071 A1 | 6/2011 | Fukusen et al. |
| 2011/0199122 A1 | 8/2011 | Morishita et al. |
| 2011/0233741 A1* | 9/2011 | Ishii et al. ................... 257/668 |
| 2011/0309475 A1* | 12/2011 | Lee ............................. 257/532 |
| 2012/0102260 A1 | 4/2012 | Kawamura et al. |
| 2012/0163071 A1 | 6/2012 | Kurokawa |
| 2013/0166519 A1* | 6/2013 | Matsuse ...................... 707/693 |
| 2013/0188422 A1* | 7/2013 | Kim et al. ................ 365/185.11 |
| 2013/0194031 A1 | 8/2013 | Poulton et al. |
| 2013/0195165 A1 | 8/2013 | Poulton et al. |
| 2013/0328597 A1 | 12/2013 | Cassia |
| 2014/0036596 A1 | 2/2014 | Chan et al. |
| 2014/0091834 A1* | 4/2014 | Chi ............................... 326/37 |
| 2014/0266417 A1 | 9/2014 | Dally et al. |
| 2014/0269010 A1 | 9/2014 | Dally |
| 2014/0269011 A1 | 9/2014 | Dally et al. |
| 2014/0269012 A1 | 9/2014 | Dally et al. |
| 2014/0281383 A1 | 9/2014 | Dally et al. |

OTHER PUBLICATIONS

Notice of Allowance from U.S. Appl. No. 13/359,433, dated Sep. 19, 2013.
Non-Final Office Action from U.S. Appl. No. 13/359,433, dated Jul. 11, 2013.
Final Office Action from U.S. Appl. No. 13/361,843, dated Oct. 18, 2013.
Non-Final Office Action from U.S. Appl. No. 13/361,843, dated Aug. 13, 2013.
Notice of Allowance from U.S. Appl. No. 13/946,980, dated Jun. 9, 2014.
Non-Final Office Action from U.S. Appl. No. 13/933,058, dated Jun. 27, 2014.
Office Action from Chinese Patent Application No. 201210457686.8, dated Jul. 23, 2014.
Non-Final Office Action from U.S. Appl. No. 14/055,823, dated Sep. 10, 2014.
Non-Final Office Action from U.S. Appl. No. 13/361,843, dated Jan. 5, 2015.
Non-Final Office Action from U.S. Appl. No. 13/890,899, dated Dec. 4, 2014.
Non-Final Office Action from U.S. Appl. No. 13/938,161, dated Dec. 4, 2014.
Notice of Allowance from U.S. Appl. No. 13/933,058, dated Oct. 15, 2014.
Non-Final Office Action from U.S. Appl. No. 13/973,952, dated Jan. 22, 2015.
Notice of Allowance from U.S. Appl. No. 14/055,823, dated Feb. 23, 2015.
Notice of Allowance from U.S. Appl. No. 13/933,058, dated Ferbuary 23, 2015.
Office Action from Taiwan Patent Application No. 101136888, dated Mar. 5, 2015.
Non-Final Office Action from U.S. Appl. No. 13/973,947, dated Feb. 4, 2015.
Office Action from Chinese Patent Application No. 201210459107.3, dated Apr. 16, 2015.

* cited by examiner

GROUND-REFERENCED SINGLE-ENDED MEMORY INTERCONNECT

This invention was made with Government support under Agreement No. HR0011-10-9-0008 awarded by DARPA, and under LLNS subcontract B599861 awarded by DOE. The Government has certain rights in the invention.

FIELD OF THE INVENTION

The present invention relates to digital signaling, and more specifically to ground-referenced single-ended signaling.

BACKGROUND

Sequential generations of computing systems typically require higher performance and, in many cases, reduced size and reduced overall power consumption. A typical computing system includes a central processing unit, a graphics processing unit, and a high-capacity memory subsystem, such as one or more dynamic random access memory (DRAM) devices. Conventional computing systems integrate one or more central processing unit cores and one or more graphics processing unit cores on a single processor system chip that is coupled to one or more DRAM chips. In certain highly-integrated computing systems, the processor system chip is packaged with one or more DRAM chips in a multi-chip module (MCM), which includes interconnection traces to couple the processor system chip to the DRAM chips.

Differential signaling is typically preferred over single-ended signaling for high-speed channels within the MCM because conventional differential signaling may be implemented to dissipate less power, generate less supply noise, and exhibit superior noise rejection properties compared to conventional single-ended signaling. However, differential signals require two input/output pads on each interconnected chip and well-matched interconnection traces per digital signal. By contrast, single-ended signals only require one signal pad per digital signal. However, conventional single-ended drivers draw data-dependent supply current, resulting in symbol-rate simultaneous switching noise (SSN) on an associated power supply network. SSN is proportional to signal level and can be overcome by reducing power supply inductance, a relatively expensive solution that typically requires additional input/output pads. Conventional single-ended signaling is also highly susceptible to electromagnetic noise because such noise is indistinguishable relative to an incoming signal.

Conventional differential signaling exhibits excellent noise characteristics, but is expensive in terms of interconnect resources. While conventional single-ended signaling requires fewer signal traces and fewer input/output pads, conventional single-ended drivers generate more SSN and conventional single-ended receivers have poor noise tolerance, especially at lower voltage swings needed for low-power operation. Thus, conventional single-ended and differential signaling both have drawbacks.

Thus, there is a need for improving signaling and/or other issues associated with the prior art.

SUMMARY

A system is provided for transmitting signals. The system comprises a first processing unit, a memory subsystem, and a package. The first processing unit is configured to include a first ground-referenced single-ended signaling (GRS) interface circuit. The memory subsystem is configured to include a second GRS interface circuit. The package is configured to include one or more electrical traces that couple the first GRS interface to the second GRS interface, where the first GRS interface circuit and the second GRS interface circuit are each configured to transmit a pulse along one trace of the one or more electrical traces by discharging a capacitor between the one trace and a ground network.

DETAILED DESCRIPTION

A technique is provided for high-speed, single-ended signaling between a processor and memory devices. A ground-referenced driver transmits a pulse having a polarity determined by a corresponding logic state. The pulse traverses a signal path and is received by a ground-referenced amplifier, which amplifies the pulse for interpretation as a conventional logic signal. A set of ground-referenced drivers and ground-referenced amplifiers implement a high-speed interface within the processor and a corresponding interface within one or more memory devices coupled to the processor. The high-speed interface advantageously improves memory bandwidth within the processor, enabling higher performance and higher density systems than provided by conventional memory signaling techniques.

Embodiments of the present invention implement a system comprising a processor chip and one or more memory chips coupled to a multi-chip package. Interconnections between the processor chip and the one or more memory chips are routed via the multi-chip package. At least one of the interconnections is configured to implement a ground-referenced single-ended signaling (GRS) link.

A GRS link implements a charge pump driver configured to transmit a ground-referenced pulse on an associated signal line. In one implementation, a pulse of positive charge indicates a logical one, while a pulse of negative charge indicates a logical zero. The charge pump driver eliminates simultaneous switching noise (SSN) commonly associated with single-ended signaling by forcing transient signal current and ground current to be locally balanced, and by drawing a constant amount of charge from the power supply each half clock cycle, independent of the data being transmitted. The pulse is received and amplified by a common gate amplifier stage configured to use a local ground signal as an input reference. This configuration provides substantial immunity to common mode noise, the dominant source of transmission errors in single-ended signaling. A second amplifier stage translates a given received pulse to full-swing logic voltages, allowing the received pulse to be properly interpreted as one or two logic states by conventional logic circuitry. In one embodiment, a GRS receiver comprises a common gate amplifier stage, the second amplifier stage, and two storage elements, such as flip-flips, configured to capture received data during alternate clock phases.

A GRS transceiver includes a GRS driver and a GRS receiver. The GRS transceiver transmits outbound data via the GRS driver and receives inbound data via the GRS receiver. An isochronous GRS transceiver may also transmit clocking information having a fixed phase relationship to the outbound data and receives clocking information having a fixed phase relationship to the inbound data.

Figure 1A:
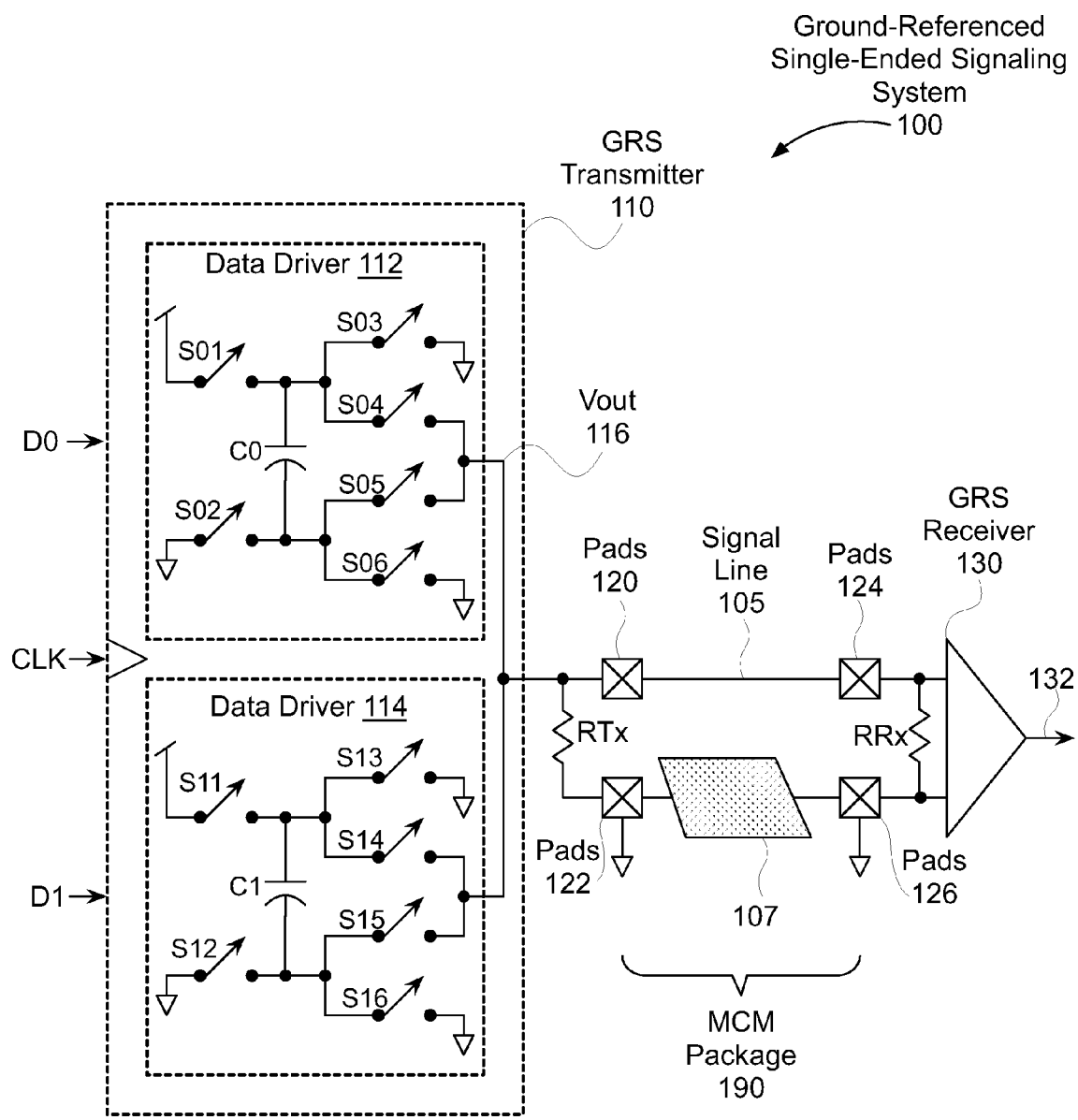
FIG. 1A illustrates a ground-referenced single-ended signaling (GRS) system that implements a GRS transmitter based on a flying capacitor charge pump, in accordance with one embodiment.

FIG. 1A illustrates a ground-referenced single-ended signaling (GRS) system 100 that implements a GRS transmitter 110 based on a flying capacitor charge pump, in accordance with one embodiment. GRS system 100 includes GRS transmitter 110, a transmission path comprising a signal line 105 and a ground network 107, and a GRS receiver 130. In one embodiment, GRS transmitter 110 comprises two data drivers 112, 114. Input data signals D0 and D1 are presented to GRS transmitter 110 based on a clock signal CLK. Data driver 112 is configured to capture a logic state associated with input D0 and drive output signal Vout 116 onto signal line 105 with a pulse corresponding to the logic state of input D0 while CLK is low. Similarly, data driver 114 is configured to capture a logic state associated with input D1 and drive output signal Vout 116 onto signal line 105 with a pulse corresponding to the logic state of D1 while CLK is high. A sequence of pulses is formed along signal line 105 corresponding to a sequence of input data from inputs D0 and D1. The sequence of pulses is referenced to ground with a voltage swing that may be lower than conventional logic voltage swings. GRS receiver 130 is configured to amplify an incoming sequence of pulses from signal line 105 and translate the pulses to a conventional logic voltage swing so the pulses may be properly interpreted as logic signals on amplifier output signal 132. For example, the sequence of pulses along signal line 105 may have a nominal amplitude of plus or minus one-hundred millivolts, while amplifier output signal 132 may have a corresponding voltage swing of twelve hundred millivolts to zero volts with respect to ground if logic coupled to amplifier output signal 132 operates on a twelve hundred millivolt positive supply rail.

In one embodiment, GRS transmitter 110 is fabricated on a transmitter chip and GRS receiver 130 is fabricated on a receiver chip distinct from the transmitter chip. Pads 120 comprise bonding pads configured to couple output signal Vout 116 from the transmitter chip to signal line 105, which is fabricated as an impedance-controlled trace within a multi-chip module (MCM) package 190. Pads 122 comprise bonding pads configured to couple a local ground signal within the transmitter chip to ground network 107, fabricated within MCM package 190. Similarly, pads 124 comprise bonding pads configured to couple signal line 105 to an input signal for GRS receiver 130 within the receiver chip, and pads 126 comprise bonding pads configured to couple ground network 107 to a local ground within the receiver chip. A termination resistor RTx is coupled between output signal Vout 116 and the local ground within the transmitter chip to absorb incoming signals, such as reflections or induced noise signals. A termination resistor RRx is coupled across inputs to GRS receiver 130 to similarly absorb incoming signals at the receiver chip.

Data driver 112 comprises capacitor C0, and switches S01 through S06. Switch S01 enables a first node of capacitor C0 to be coupled to a positive supply rail, while switch S02 enables a second node of capacitor C0 to be coupled to a local ground net. Switches S01 and S02 are active (closed) during a pre-charge state for data driver 112, defined when CLK is equal to a logical "1" value. Switch S03 enables the first node of capacitor C0 to be coupled to GND, while switch S06 enables the second node of capacitor C0 to be coupled to GND. Switch S04 enables the first node of capacitor C0 to be coupled to Vout 116, while switch S05 enables the second node of capacitor C0 to be coupled to Vout 116. When CLK is equal to a logical "0" value, switches S04 and S06 are active when data driver 112 is driving a logical "1" value to Vout 116, or switches S03 and S05 are active when data driver 112 is driving a logical "0" value to Vout 116. Data driver 114 comprises a substantially identical circuit topology, with an inverted sense for CLK, so that data driver 114 is in a pre-charge state when CLK is equal to a logical "0" value and driving Vout 116 when CLK is equal to a logical "1" value.

In one embodiment, switches S01 through S06 and switches S11 through S16 are fabricated using monolithic complementary metal-oxide semiconductor (CMOS) devices, such as enhancement mode n-channel and p-channel field-effect transistors. Any technically feasible logic circuit topologies may be implemented to drive switches S01-S06 and switches S11-S16 into individually active or inactive states without departing the scope and spirit of embodiments of the present invention.

Figure 1B:
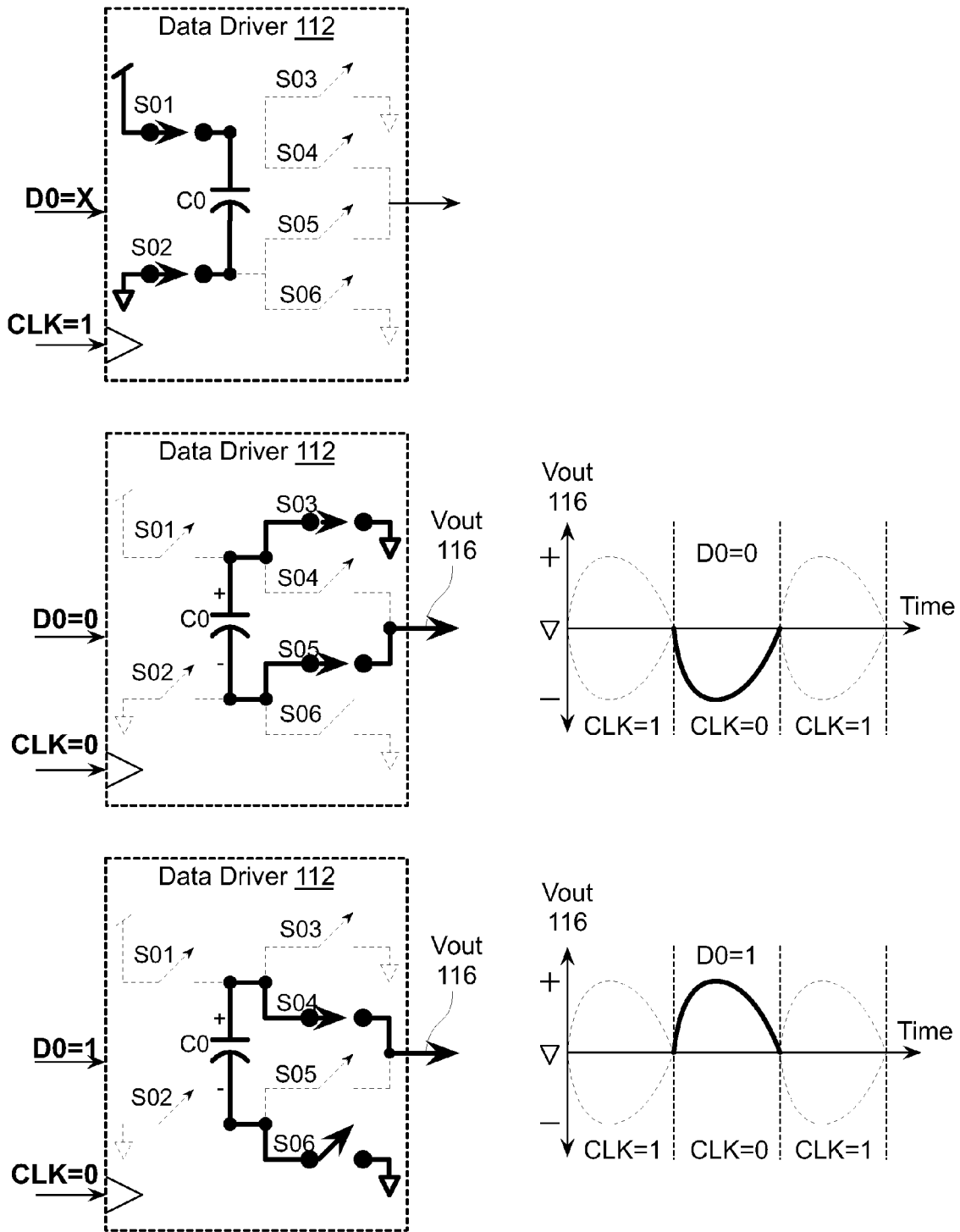
FIG. 1B illustrates operation of a data driver in a pre-charge state and in two different data-dependent drive states, in accordance with one embodiment.

FIG. 1B illustrates operation of a data driver 112 in a pre-charge state and in two different data-dependent drive states, in accordance with one embodiment. As shown, when CLK is equal to a logical "1" value, data driver 112 is in a pre-charge state, whereby switches S01 and S02 are active and capacitor C0 charges to a voltage corresponding approximately to a positive supply rail, such as a "VDD" supply rail. All of switches S03-S06 are inactive (open) during the pre-charge state. When CLK is equal to a logical "0" value, two of switches S03-S06 are configured to couple capacitor C0 to Vout 116 to transmit a pulse having a polarity corresponding to a logical value for D0. To drive a logical "0" value, switches S03 and S05 are driven active, thereby coupling a negative charge relative to ground onto Vout 116. To drive a logical "1" value, switches S04 and S06 are driven active, thereby coupling a positive charge relative to ground onto Vout 116.

Figure 1C:
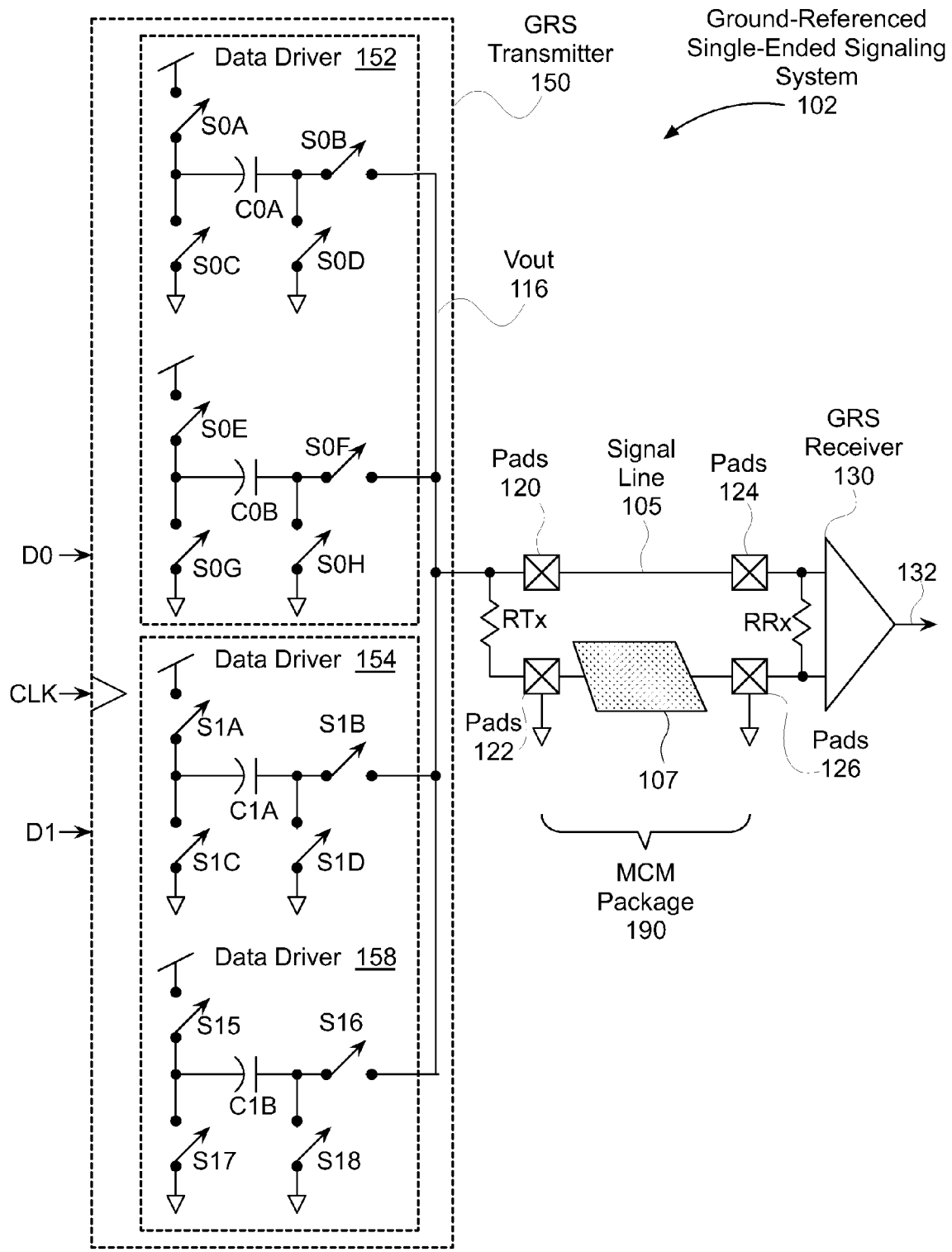
FIG. 1C illustrates a GRS system that implements a GRS transmitter based on a dual-capacitor charge pump, in accordance with one embodiment.

FIG. 1C illustrates a GRS system 102 that implements a GRS transmitter 150 based on a dual-capacitor charge pump, in accordance with one embodiment. GRS system 102 includes GRS transmitter 150, a transmission path comprising a signal line 105 and a ground network 107, and a GRS receiver 130. In one embodiment, GRS transmitter 150 comprises two data drivers 152 and 154. Operation of GRS system 102 is substantially identical to the operation of GRS system 100 described above in FIGS. 1A and 1B, with the exception of the internal topology and operation of data drivers 152 and 154.

Data driver 152 comprises capacitors C0A and C0B, as well as switches S0A through S0H. Switch S0A enables a first node of capacitor C0A to be coupled to a positive supply rail, while switch S0C enables the first node to be coupled to a local ground net. Switch S0B enables a second node of capacitor C0A to be coupled to Vout 116, while switch S0D enables the second node to be coupled to the local ground net. Similarly, switch S0E enables a first node of capacitor C0B to be coupled to the positive supply rail, while switch S0G enables the first node to be coupled to the local ground net. Switch S0F enables a second node of capacitor C0B to be coupled to Vout 116, while switch S0H enables the second node to be coupled to the local ground net.

A pre-charge state for data driver 152 is defined when CLK is equal to a logical "1" value. During the pre-charge state, switches S0A, S0D, S0G, and S0H are driven active, pre-charging capacitor C0A to a voltage corresponding to the positive supply rail relative to the local ground net, and pre-charging capacitor C0B to have approximately no charge. When CLK is equal to a logical "0" value, either capacitor C0A is coupled to Vout 116 to generate a negative pulse or capacitor C0B is coupled to Vout 116 to generate a positive pulse, as described below in conjunction with FIG. 1E. Data driver 154 comprises a substantially identical circuit topology, with an inverted sense for CLK, so that data driver 154 is in a pre-charge state when CLK is equal to a logical "0" value and driving Vout 116 when CLK is equal to a logical "1" value.

In one embodiment, switches S0A through S0H and switches S1A through S1H are fabricated using monolithic CMOS devices, such as enhancement mode n-channel and p-channel FETs. Any technically feasible logic circuit topologies may be implemented to drive switches S0A-S0H and switches S1A-S1H into individually active or inactive states without departing the scope and spirit of embodiments of the present invention.

Figure 1D:
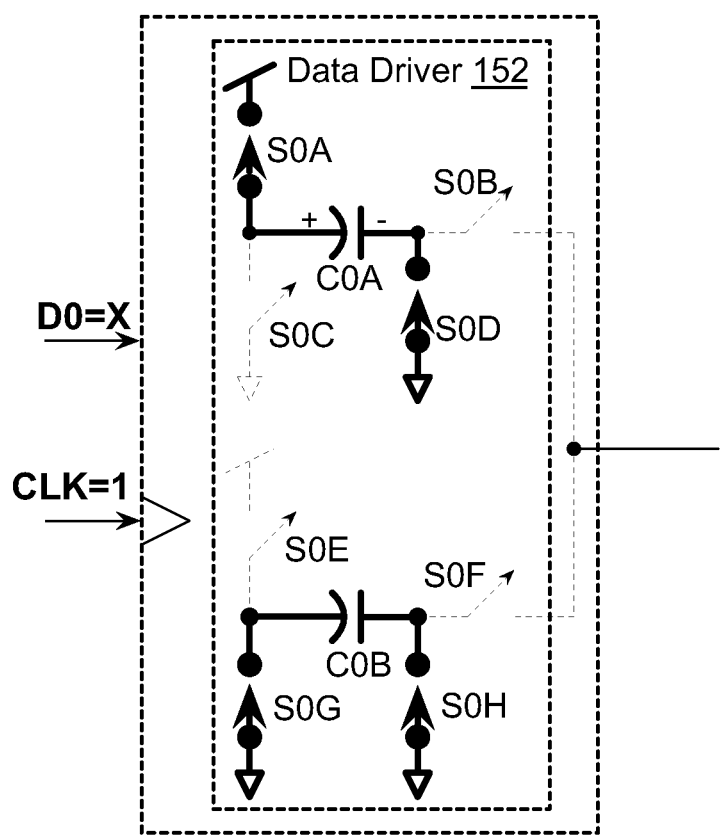
FIG. 1D illustrates operation of a data driver in a pre-charge state, in accordance with one embodiment.

FIG. 1D illustrates operation of data driver 152 in a pre-charge state, in accordance with one embodiment. As shown, when CLK is equal to a logical "1" value, switch S0A is active, coupling a first node of capacitor C0A to a positive supply rail, and switch S0D is active, coupling a second node of capacitor C0A to a local ground net. At the same time, switch S0G is active, coupling a first node of capacitor C0B to ground, and switch S0H is active, coupling a second node of capacitor C0B to ground. By the end of this pre-charge state, capacitor C0B is substantially discharged.

Figure 1E:
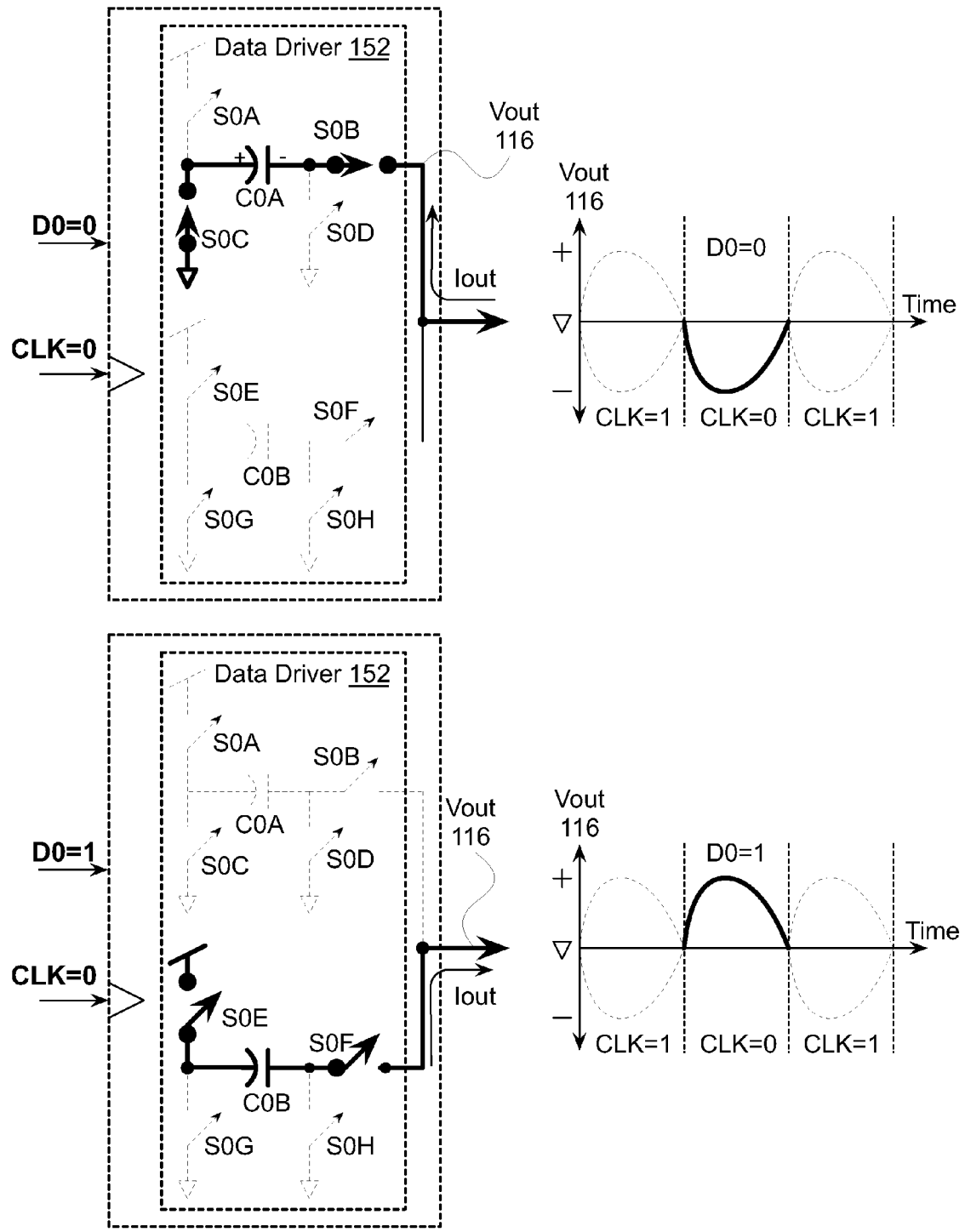
FIG. 1E illustrates operation of a data driver in different data-dependent drive states, in accordance with one embodiment.

FIG. 1E illustrates operation of data driver 152 in different data-dependent drive states, in accordance with one embodiment. As shown, when CLK is equal to a logical "0" value and D0 is equal to a logical "0" value, switches S0C and S0B are configured to couple capacitor C0A to Vout 116 to transmit a pulse having a negative polarity. Alternatively, when CLK is equal to a logical "0" value and D0 is equal to a logical "1" value, switches S0E and S0F are configured to couple capacitor C0B to Vout 116 to transmit a pulse having a positive polarity. Here, the positive supply rail is assumed to have adequate high-frequency capacitive coupling to the local ground net to force transient return current through the local ground net in conjunction with driving Vout 116 with a positive pulse.

More illustrative information will now be set forth regarding various optional architectures and features with which the foregoing framework may or may not be implemented, per the desires of a designer or user. It should be strongly noted that the following information is set forth for illustrative purposes and should not be construed as limiting in any manner. Any of the following features may be optionally incorporated with or without the exclusion of other features described.

Figure 1F:
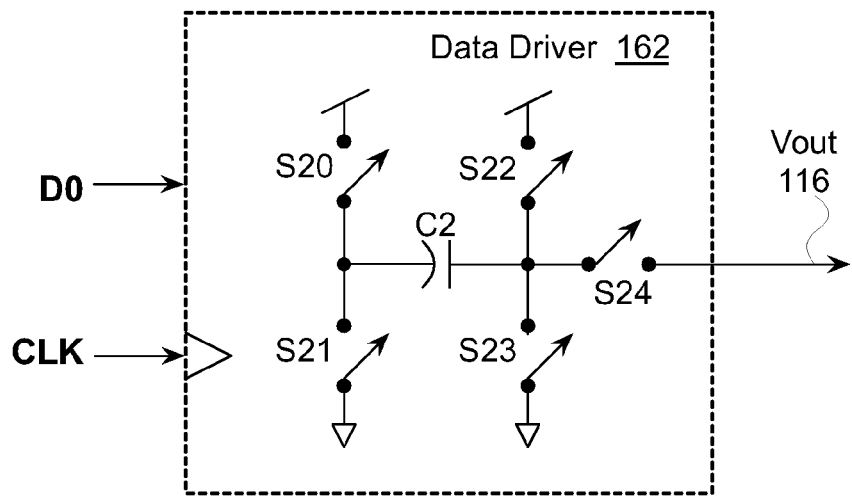
FIG. 1F illustrates operation of a ground-referenced single-ended data driver based on a flying capacitor charge pump, in accordance with one embodiment.

FIG. 1F illustrates operation of a ground-referenced single-ended data driver 162 based on a flying capacitor charge pump, in accordance with one embodiment. One or more instances of data driver 162 may be configured to operate as data drivers within a GRS transmitter. For example, an instance of data driver 162 may be configured to operate in place of data driver 112 within GRS transmitter 110 of FIG. 1A. Similarly, an instance of data driver 162 may be configured to operate in place of data driver 114.

Data driver 162 includes capacitor C2, and switches S20, S21, S22, S23, and S24, configured to pre-charge capacitor C2 during a pre-charge phase, and discharge capacitor C2 into Vout 116 during a data output phase. In one embodiment, a first instance of data driver 162 is configured to operate in a pre-charge phase when a clock signal is in a logical "0" state and a data output phase when the clock signal is in a logical "1" state. A second instance of data driver 162 is configured to operate in a pre-charge phase when the clock signal is in a logical "1" state and a data output phase when the clock signal is in a logical "0" state.

When each instance of data driver 162 is in the pre-charge phase, if D0 is in a logical "1" state, then switches S22 and S21 are active, while switches S20, S23, and S24 are inactive. While in the pre-charge phase, if D0 is in a logical "0" state, then switches S20 and S23 are active, while switches S21, S22, and S24 are inactive. During a data output phase, switches S21 and S24 are active, while switches S20, S22, and S23 are inactive. In sum, flying capacitor C2 is pre-charged with either a positive or negative polarity charge during the pre-charge phase. The charge is then discharged through ground and Vout 116 during the data output phase.

Figure 1G:
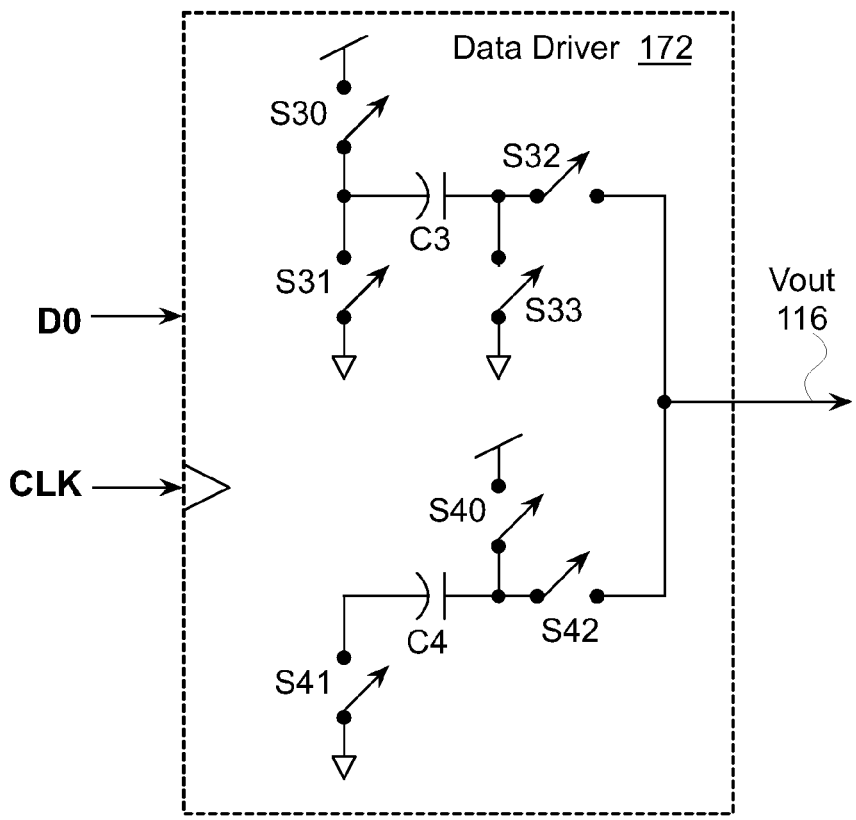
FIG. 1G illustrates operation of a ground-referenced single-ended data driver based on a dual capacitor charge pump, in accordance with one embodiment.

FIG. 1G illustrates operation of a ground-referenced single-ended data driver 172 based on a dual capacitor charge pump, in accordance with one embodiment. One or more instances of data driver 172 may be configured to operate as data drivers within a GRS transmitter. For example, an instance of data driver 172 may be configured to operate in place of data driver 112 within GRS transmitter 110 of FIG. 1A. Similarly, an instance of data driver 162 may be configured to operate in place of data driver 114.

Data driver 172 includes capacitors C3, C4, and switches S30, S31, S32, S33, S40, S41, and S42, configured to pre-charge capacitors C3 and C4 during a pre-charge phase, and discharge one of capacitors C3, C4 into Vout 116 during a data output phase. In one embodiment, a first instance of data driver 172 is configured to operate in a pre-charge phase when a clock signal is in a logical "0" state and a data output phase when the clock signal is in a logical "1" state. A second instance of data driver 172 is configured to operate in a pre-charge phase when the clock signal is in a logical "1" state and a data output phase when the clock signal is in a logical "0" state.

When each instance of data driver 172 is in the pre-charge phase, switches S30, S33, S40, and S41 are active, and switches S31, S32, and S42 are inactive. During the data output phase, if D0 is in a logical "0" state, then switches S31 and S32 are active, allowing capacitor C3 to discharge a negative polarity charge into Vout 116. At the same time, switches S30, S33, and S40-S42 are inactive. During the data output phase, if D0 is in a logical "1" state, then switches S41 and S42 are active, allowing capacitor C4 to discharge a positive polarity charge into Vout 116. At the same time, switches S40 and S30-S33 are inactive.

Figure 2A:
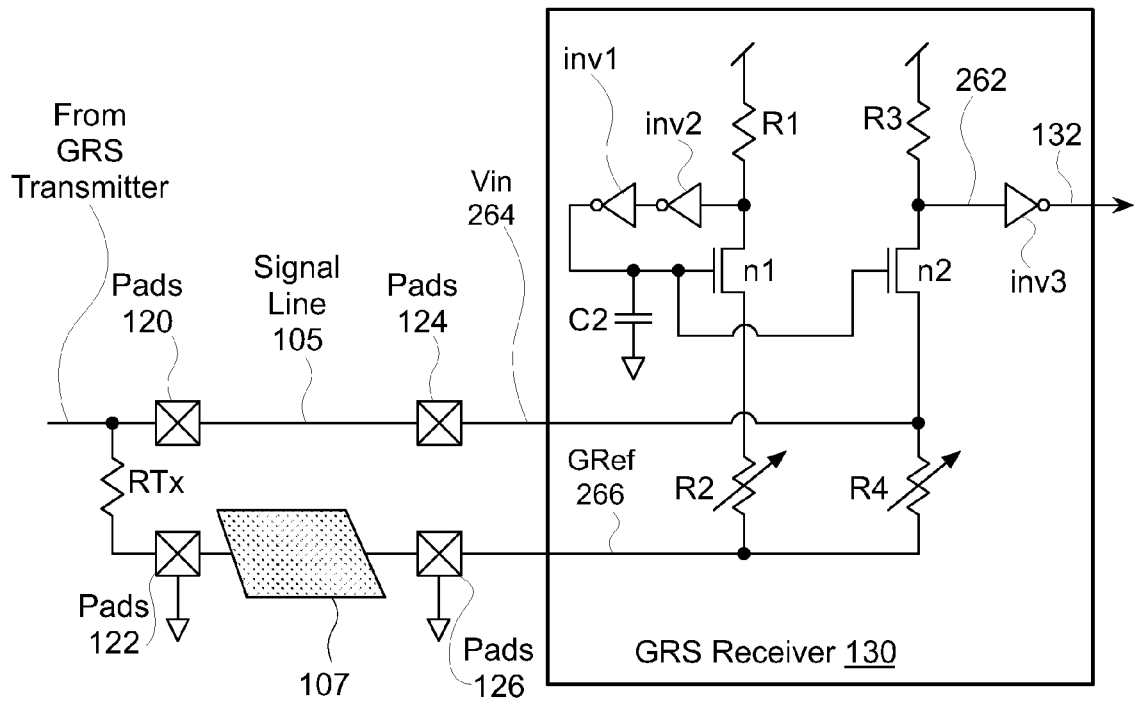
FIG. 2A illustrates an exemplary ground-referenced single-ended receiver, in accordance with one embodiment.

FIG. 2A illustrates an exemplary GRS receiver 130, in accordance with one embodiment. As shown, GRS receiver 130 receives input signals Vin 264 and GRef 266, and generates amplifier output signal 132. In one embodiment, an arriving pulse at Vin 264 having a positive voltage with respect to GRef 266 represents a logical "1" and an arriving pulse at Vin 264 having a negative voltage with respect to GRef 266 represents a logical "0". GRS receiver 130 amplifies a differential voltage between input signals Vin 264 and GRef 266 to generate a corresponding difference signal 262. In one embodiment, GRS receiver 130 is designed to bias difference signal 262 to be centered about a switching threshold for inverter inv3, which amplifies difference signal 262 to generate amplifier output signal 132 according to conventional logic voltage levels.

In one embodiment, GRS receiver 130 comprises resistors R1 through R4, inverters inv1 through inv3, capacitor C2, and field-effect transistors n1 and n2. Resistors R2 and R4 may be implemented as variable resistors, using any technically feasible technique. One exemplary implementation of a variable resistor provides digital control of a resistance value and comprises a set of n-channel FETs connected in a parallel configuration. Each n-channel FET is controlled by a different digital control signal from a control word used to establish the resistance value. If the control word is defined to be a binary number, a corresponding resistance value for the set of n-channel FETs may be monotonic if the n-channel FETs are sized appropriately. In a practical implementation, resistors R2 and R4 are tuned to balance the termination of incoming pulses and current injected into Vin 264 and GRef 266 by GRS receiver 130. A monotonic mapping from a binary code word to a resistance value simplifies any required digital trimming needed to achieve balanced termination. Any technically feasible technique may be implemented to adjust resistors R2 and R4 to achieve balanced termination.

Resistors R1 and R3 may also be implemented using any technically feasible technique. For example, resistors R1 and R3 may be implemented as p-channel FETs that are biased appropriately. Inverters inv1 and inv2 provide gain, while capacitor C2 serves to stabilize a loop formed by inverters inv1 and inv2, in conjunction with resistor R1 and FET n1.

Figure 2B:
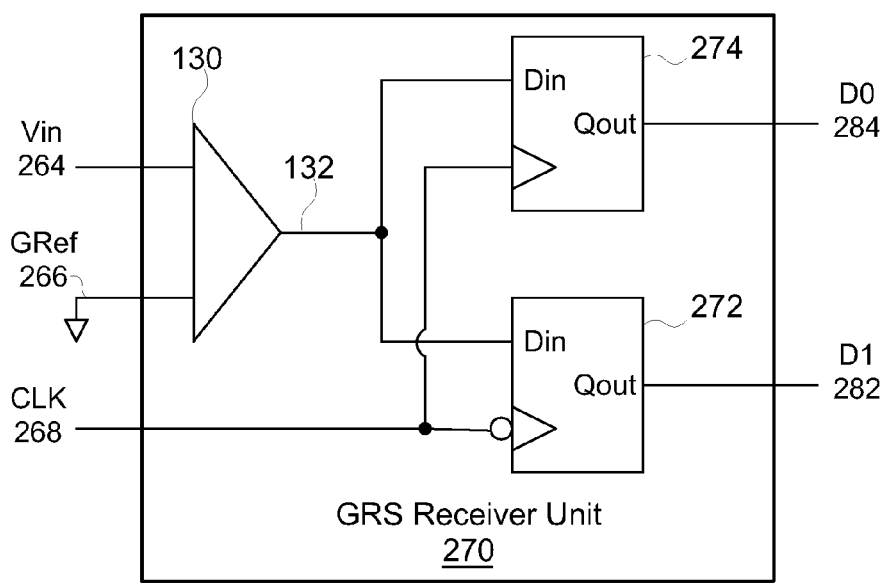
FIG. 2B illustrates an exemplary ground-referenced single-ended receiver, configured to demultiplex incoming data, in accordance with one embodiment.

FIG. 2B illustrates an exemplary GRS receiver unit 270, configured to demultiplex incoming data, in accordance with one embodiment. GRS receiver unit 270 comprises a GRS receiver 130, and storage elements configured to capture and store the logic state of amplifier output signal 132 on alternating clock phases to demultiplex input data represented as arriving pulses on input signal Vin 264, referenced to input signal GRef 266. Each output signal D0 284 and D1 282 presents captured input data at half the frequency of the arriving data pulses.

In one embodiment, the storage elements comprise a positive edge triggered flip-flop 274 and a negative edge triggered flip-flop 272. As shown, positive edge triggered flip-flop 274 is configured to capture D0 during the rising edge of a clock signal CLK 268, while negative edge triggered flip-flop 272 is configured to capture D1 during a falling edge of CLK 268. Such a configuration assumes that CLK 268 and amplifier output signal 132 transition together and that flip-flops 272 and 274 require more setup time than hold time. In alternative embodiments, D0 is captured on a falling edge of CLK 268, while D1 is captured on a rising edge of CLK 268. In other alternative embodiments, the storage elements comprise level-sensitive latches rather than flip-flops.

Figure 3:
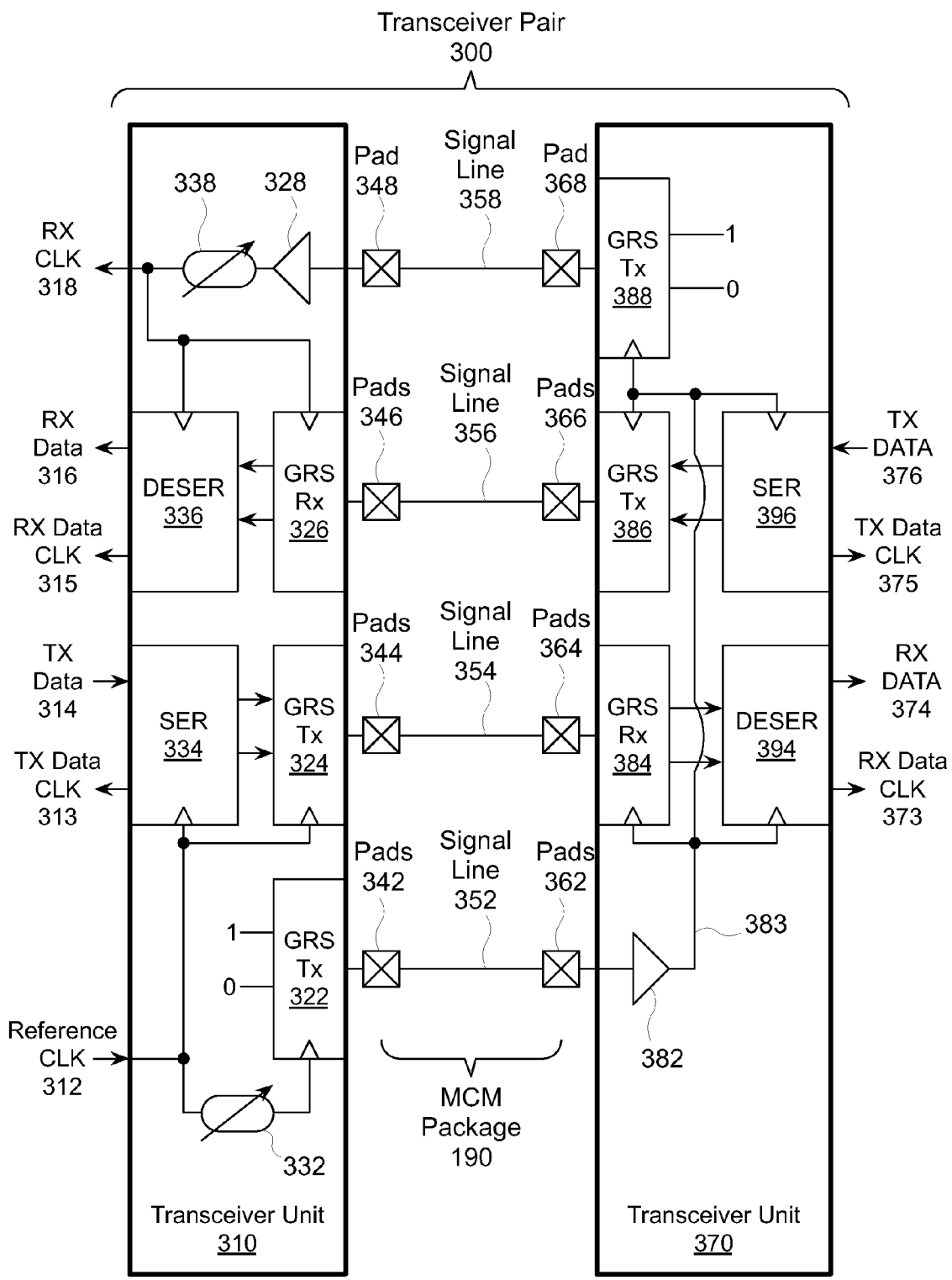
FIG. 3 illustrates an exemplary transceiver pair, configured to implement ground-referenced single-ended signaling, in accordance with one embodiment.

FIG. 3 illustrates an exemplary transceiver pair 300, configured to implement GRS signaling, in accordance with one embodiment. As shown, the transceiver pair 300 includes transceiver unit 310 coupled to transceiver unit 370 via signal lines 352, 354, 356, and 358. Signal lines 352, 354, 356, and 358 may be manufactured as controlled-impedance traces embedded within an MCM package 190. Transceiver 310 is configured to receive a reference clock 312 operating at one half the data transmission rate for the signal lines. Adjustable phase delay 332 may introduce an adjustable phase delay prior to transmitting reference clock 312 to GRS transmitter 322, GRS transmitter 324, and serializer 334.

As shown, the GRS transmitter 322 is configured to transmit a sequential "01" pattern to the GRS receiver 382 via pads 342, signal line 352, and pads 362. In one embodiment, this "01" pattern is transmitted at substantially the same phase as data transmitted from the GRS transmitter 324 to GRS receiver 384 via pads 344, signal line 354, and pads 364. Serializer 334 receives transmit data 314 at a lower frequency than reference clock 312, but at a correspondingly wider parallel width. For example, if reference clock 312 is configured to operate at 10 GHz, and serializer 334 is configured to multiplex a sixteen bit word into two bits for transmission via GRS transmitter 324, then sixteen bit words may arrive at a rate of 10 GHz divided by eight or 1.25 GHz. Here, a transmission data clock 313 may be generated by serializer 334 to operate at 1.25 GHz for timing transfers of arriving transmit data 314. In this example, reference clock 312 has a 100 pS period and each distinct bit transmitted by GRS transmitters 322 and 324 has a unit interval of 50 pS.

GRS receiver 382 receives a phase-delayed version of reference clock 312 via signal line 352 and generates a local reference clock 383, which may be coupled to GRS receiver 384 for capturing arriving pulses on signal line 354. Local reference clock 383 may also be coupled to deserializer 394 for capturing and demultiplexing data from GRS receiver 384. Extending the above example, GRS receiver 384 may capture arriving pulses on alternating clock phases of local reference clock 383, operating at 10 GHz, to generate two bits every 100 pS. Deserializer 394 is configured to demultiplex sequential data comprising two bits from GRS receiver 384 and to generate corresponding sixteen-bit words at a rate of 1.25 GHz. The sixteen-bit words are presented as receive data 374. Deserializer 394 may generate receiver data clock 373 to reflect appropriate clocking for receive data 374. Receive data 374 represents a local copy of transmit data 314. In one embodiment, deserializer 394 is configured to align arriving data along word boundaries. Persons skilled in the art will understand that serialization and deserialization of parallel data may require alignment of the parallel data along word boundaries and that well-known techniques in the art may be implemented by transceiver unit 370 or associated logic without departing the scope and spirit of embodiments of the present invention.

Serializer 396 captures arriving transmit data 376 and serializes the data for transmission by GRS transmitter 386 via signal line 356. In one embodiment, serializer 396 generates transmit data clock 375 based on local reference clock 383 as a clocking reference for arriving transmit data 376. GRS receiver 326 captures the data arriving from signal line 356 and deserializer 336 demultiplexes the data into words, presented as receive data 316. GRS transmitter 388 is configured to transmit a sequential "01" pattern to GRS receiver 328 via pads 368, signal line 358, and pads 348. In one embodiment, this "01" pattern is transmitted at substantially the same phase as data transmitted from GRS transmitter 386 to GRS receiver 326 via pads 366, signal line 356, and pads 346. GRS receiver 328 and adjustable phase delay 338 generate receive clock 318 based on the sequential "01" pattern. In one embodiment, receive data clock 315 is generated by deserializer 336 to reflect appropriate clocking for receive data 316.

Determining a proper phase delay value for adjustable phase delay 332 and adjustable phase delay 338 may be performed using any technically feasible technique. For example, phase delay values for adjustable phase delay 332 and adjustable phase delay 338 may be swept over a range of phase delay values during a link training phase, whereby phase delays corresponding to a substantially minimum bit error rate during training are determined and used for normal link operation.

Although an isochronous clocking model is illustrated herein for transmitting data between transceiver unit 310 and transceiver unit 370, any technically feasible clocking model may be implemented without departing the scope and spirit of embodiments of the present invention.

Figure 4A:
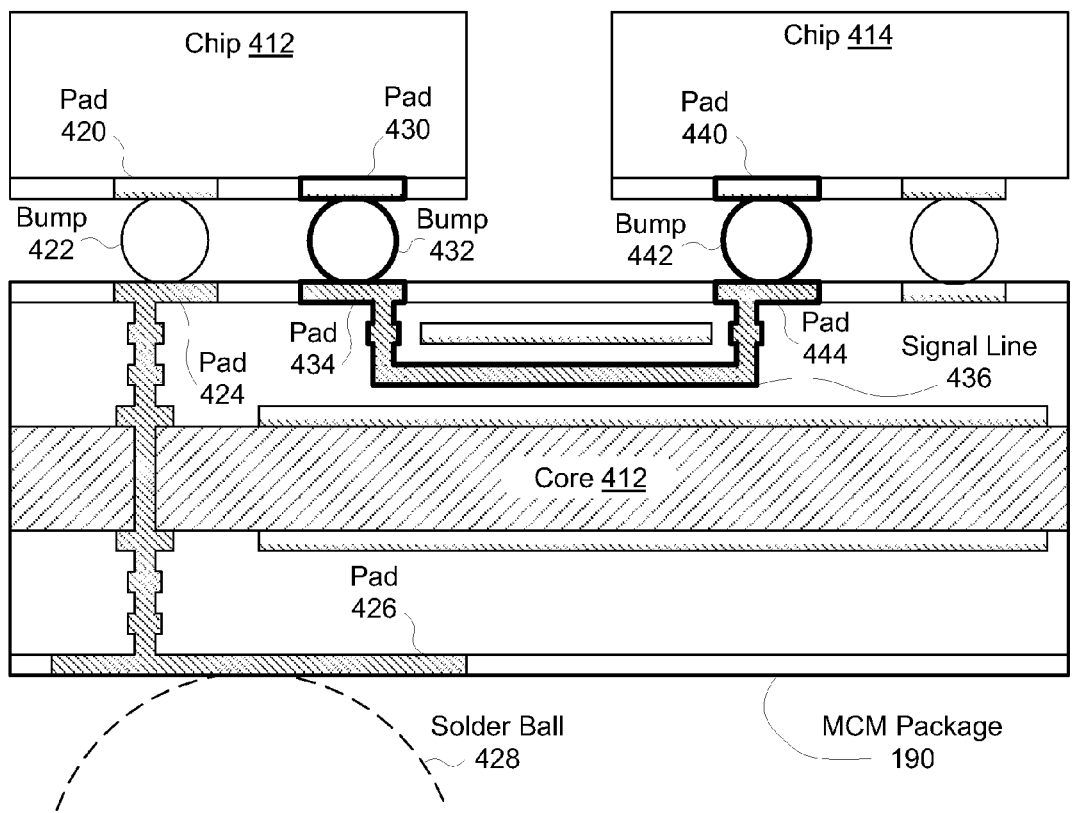
FIG. 4A illustrates a cross-section of a multi-chip module package, configured to interconnect two chips via a signal line, in accordance with one embodiment.

FIG. 4A illustrates a cross-section of MCM package 190, configured to interconnect chip 412 and chip 414 via a signal line 436, in accordance with one embodiment. As shown, chip 412 is coupled to MCM package 190 via at least bond pads 420 and 430, chip connection bumps 422 and 432, and bond pads 424 and 434. Similarly, chip 414 is coupled to MCM package 190 via at least bond pad 440, chip connection bump 442, and bond pad 444. In one embodiment, pad 430, pad 434, and bump 432 comprise pads 120 of FIG. 1A. Furthermore, pad 440, pad 444, and bump 442 comprise pads 124, and signal line 436 comprises signal line 105. An on-chip signal within chip 412 may be routed for external connection to a printed circuit board (not shown) via pad 420, bump 422, pad 424, and pad 426. Pad 426 is coupled to solder ball 428, which is configured to electrically and mechanically couple pad 426 to a bonding pad on the circuit board. MCM package 190 may include a structural and dielectric core 412.

MCM package 190 may be fabricated from any technically feasible materials, including, without limitation, organic fibers, organic polymers, organic laminates, composites, epoxy substrates, epoxy adhesives, ceramics, plastics, silicon or a semiconducting crystalline compound, or any combination or composite thereof. In one embodiment, different interconnection layers comprising MCM package 190 are fabricated separately and laminated together. In one embodiment, signal line 436 is fabricated as an impedance-controlled trace within MCM package 190. In certain implementations, signal line 436 is fabricated as an impedance-controlled strip line.

Figure 4B:
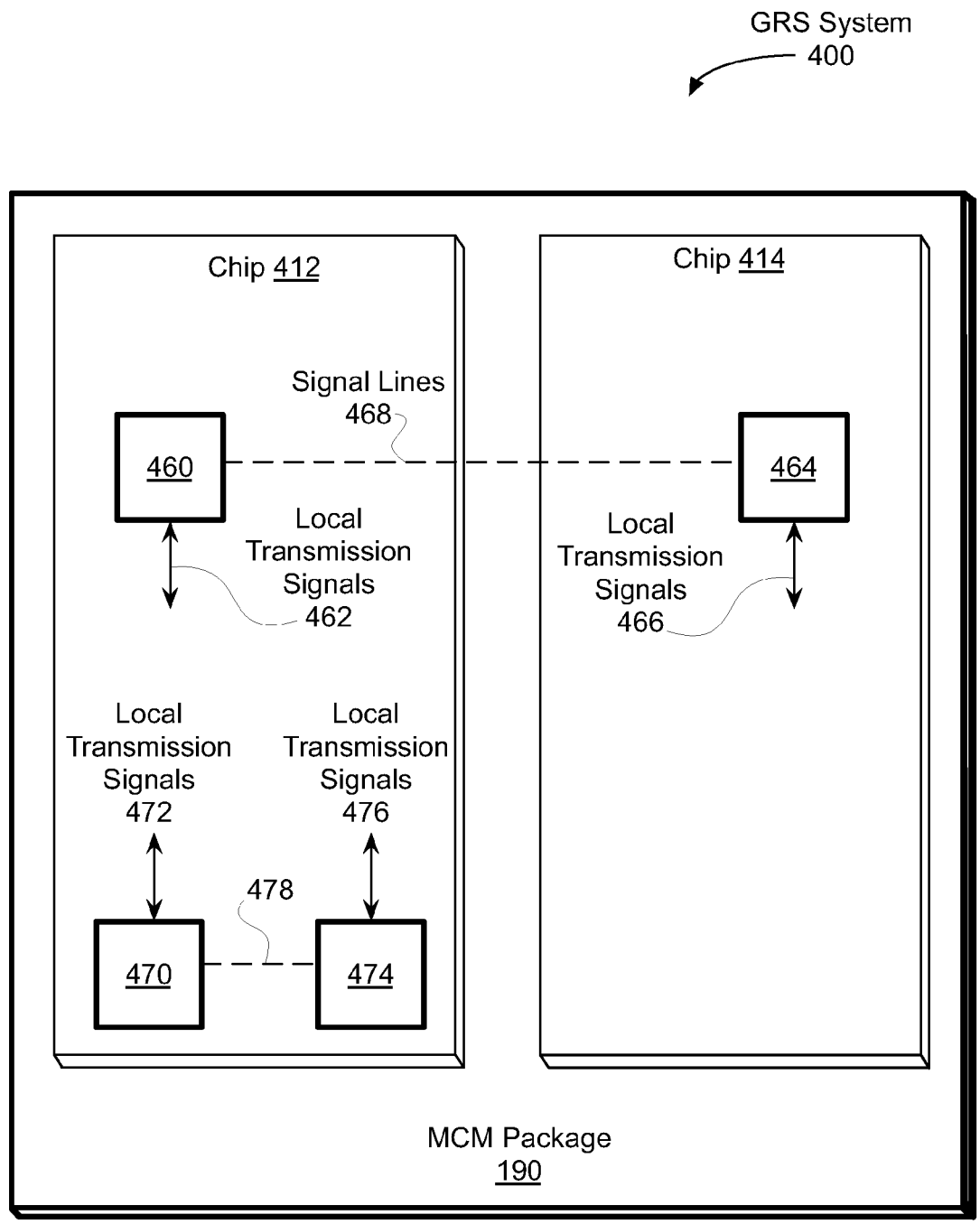
FIG. 4B illustrates a ground-referenced single-ended signaling system, configured to transmit data via signal lines embedded within a multi-chip module package, in accordance with one embodiment.

FIG. 4B illustrates a GRS system 400, configured to transmit data via signal lines 468 fabricated within MCM package 190 of FIG. 3, in accordance with one embodiment. As shown, GRS transceiver 460 is coupled to GRS transceiver 464 via signal lines 468. In one embodiment, GRS transceiver 460 comprises an instance of GRS transceiver 310, and GRS transceiver 464 comprises an instance of GRS transceiver 370. In such an embodiment, local transmission signals 462 comprise at least transmit data 314, receive data 316, and reference clock 312 and local transmission signals 466 comprise at least receive data 374 and transmit data 376. Transmission between GRS transceiver 460 and GRS transceiver 464 illustrates inter-chip communication via MCM package 190. In certain scenarios, intra-chip communication is facilitated by GRS signaling. As shown, GRS transceiver 470 is coupled to GRS transceiver 474 via signal lines 478 to provide intra-chip communication within chip 412. In one embodiment, GRS transceiver 470 comprises an instance of GRS transceiver 310, and GRS transceiver 474 comprises an instance of GRS transceiver 370.

In alternative embodiments, GRS transceiver 460 and GRS transceiver 464 may comprise different combinations of one or more GRS transmitter, such as GRS transmitter 110, and one or more GRS receivers, such as GRS receiver 130. For example, GRS transceiver 460 may implement an arbitrary number of GRS transmitters for transmitting data, or an arbitrary number of data drivers within a given GRS transmitter for generating pulses that encode data.

Figure 5A:
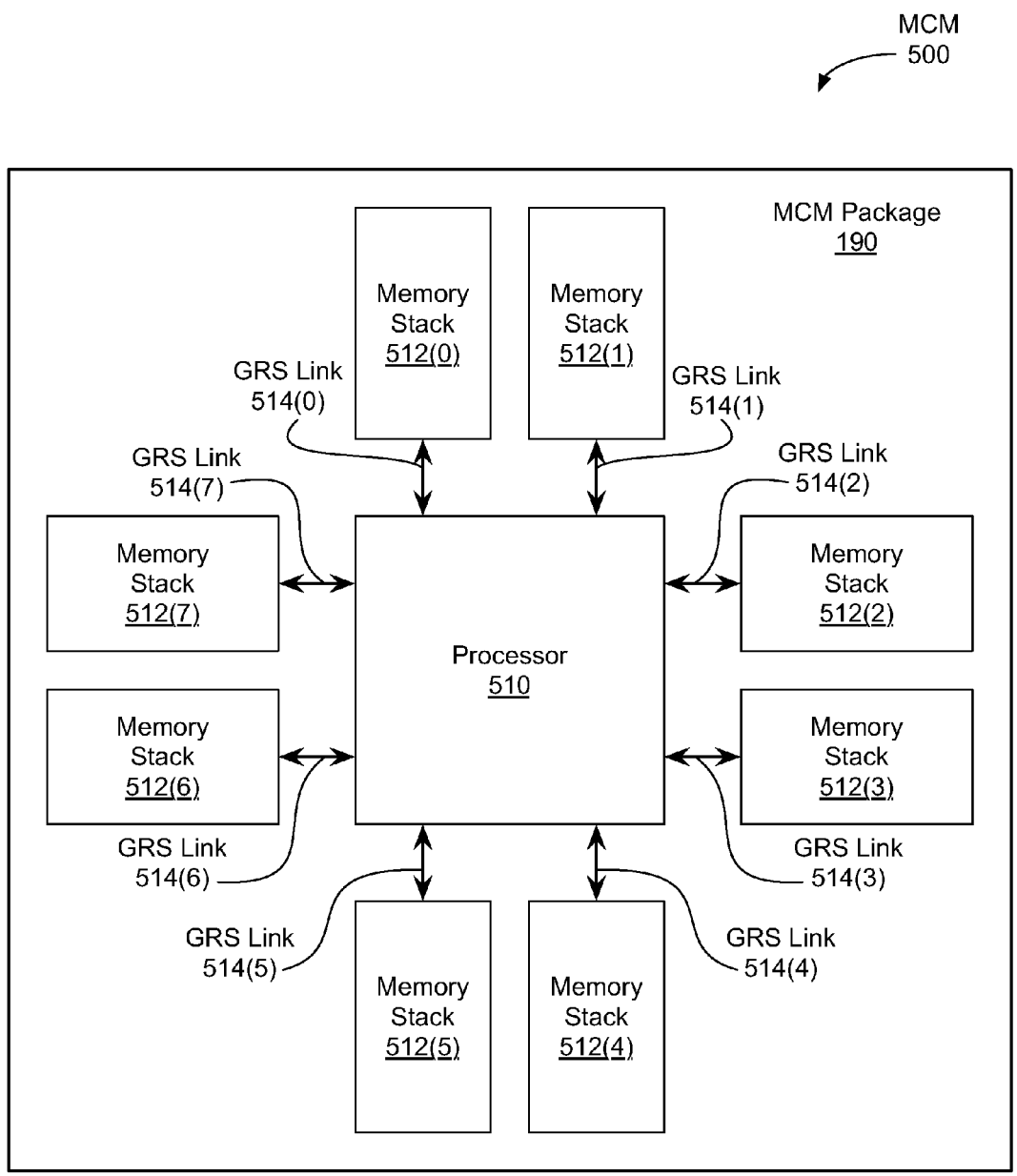
FIG. 5A illustrates a multi-chip module comprising a processor and at least one memory stack coupled to a multi-chip module package, in accordance with one embodiment.

FIG. 5A illustrates an MCM 500 comprising a processor 510 and at least one memory stack 512 coupled to an MCM package 190 of FIG. 1A, in accordance with one embodiment. As shown, processor 510 is coupled to the at least one memory stack 512 via a corresponding GRS link 514. Each GRS link 514 comprises at least one GRS signal. For example GRS link 514(0) may include GRS signals configured to transmit data from processor 510 to a memory stack 512(0), and other GRS signals configured to transmit data from memory stack 512(0) to processor 510. GRS link 514(0) may include GRS signals configured to transmit address and control information separately from other GRS signals configured to carry either read data or write data.

In one embodiment, processor 510 comprises a central processing unit. In another embodiment, processor 510 comprises a cluster of central processing units. In yet another embodiment, processor 510 comprises a processor complex that includes at least one central processing unit and at least one graphics processing unit. In an alternative embodiment, processor 510 comprises a graphics processing unit.

In one embodiment, at least one memory stack 512 comprises a dynamic random access memory (DRAM) device. In another embodiment, at least one memory stack 512 comprises a static random access memory (SRAM) device. In yet another embodiment, at least one memory stack 512 comprises a spin-torque memory device, a phase-change memory device, a memristor memory device, or a FLASH memory device. In certain embodiments, one memory stack 512 comprises volatile memory devices, such as DRAM devices, while another memory stack 512 comprises non-volatile memory devices such as spin-torque memory devices or FLASH memory devices.

Figure 5B:
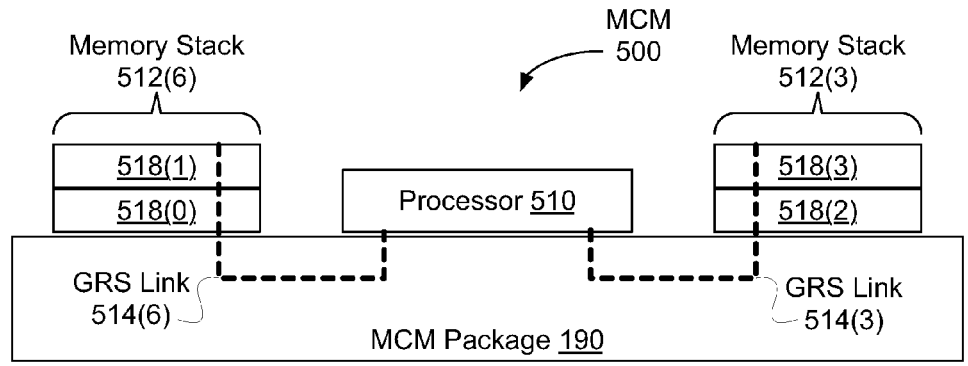
FIG. 5B illustrates a cross-sectional view of a processor within a multi-chip module coupled to at least one memory stack via a multi-chip module package, in accordance with one embodiment.

FIG. 5B illustrates a cross-sectional view of processor 510 within multi-chip module 500, coupled to at least one memory stack 512 via multi-chip module package 190, in accordance with one embodiment. As shown, each memory stack 512 comprises one or more memory chips 518. In one embodiment, memory chips 518 are fabricated to include through-die vias (also known as "through-silicon vias" or simply "silicon vias"). The through-die vias provide electrical connectivity from the bottom surface to the top surface of each memory chip 518, allowing a common electrical connection to be formed along a vertical signal path that may traverse each memory chip 518 in a memory stack 512. In one embodiment, GRS link 514 is coupled to each memory chip 518 in a memory stack 512 along the vertical signal path.

Figure 5C:
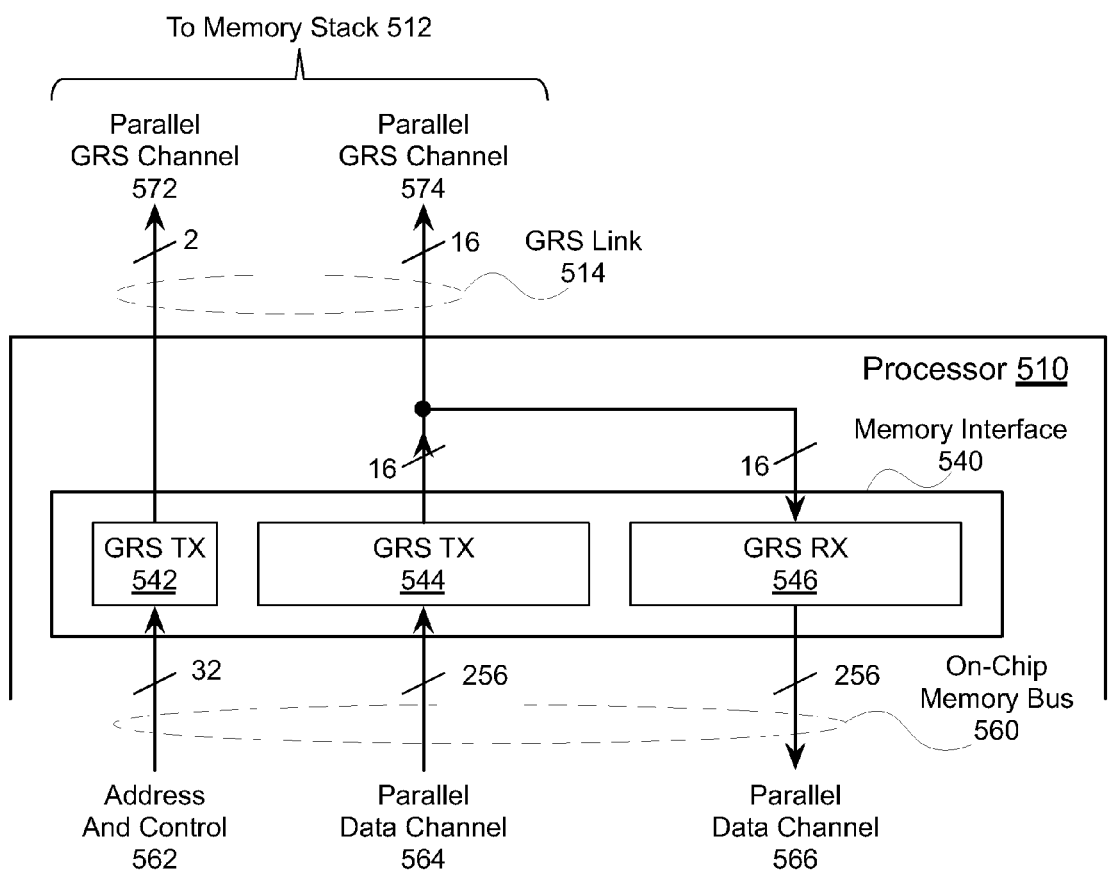
FIG. 5C illustrates a memory interface configured to implement ground-referenced single-ended signaling for coupling a processor to a memory stack, in accordance with one embodiment.

FIG. 5C illustrates a memory interface 540 configured to implement GRS signaling for coupling processor 510 to a memory stack 512, in accordance with one embodiment. Each GRS link 514 implemented within processor 510 may include a corresponding instance of memory interface 540. As shown, memory interface 540 includes an on-chip memory bus 560 comprising parallel address and control signals 562, a parallel data channel 564 for outbound data to be written to devices within a memory stack 512, and a parallel data channel 566 for inbound data arriving from devices within memory stack 512. GRS link 514 comprises a parallel GRS channel 572, for transmitting address and control information to memory stack 512, and a bi-directional parallel GRS channel 574 for transmitting data to and from memory stack 512.

Address and control signals 562 are serialized by GRS transmitter unit 542 for transmission via parallel GRS channel 572. Outbound data within parallel data channel 564 is serialized by GRS transmitter unit 544 for transmission via parallel GRS channel 574. In one embodiment, GRS transmitter units 542, 544 comprise the transmit side circuitry of transceiver 310 of FIG. 3. Inbound data arrives via parallel GRS channel 574 and is deserialized into parallel data channel 566 by GRS receiver unit 546. In one embodiment, address and control signals 562 comprise row and column address information, bank selection information, and memory device control commands, such as DRAM, or FLASH memory commands. In one embodiment, address and control signals 562 comprise a command field, a bank address field, a row address field, and a column address field. Furthermore, GRS transmitter 452 is configured to serialize the command field, the bank address field, and either the row address field or the columns address field.

In one embodiment, each memory chip 518 is configured to include two or more independent regions of memory, known in the art as partitions. Furthermore, each partition is assigned a separate GRS link 514 for efficient, independent access to each partition. In certain embodiments, each memory chip 518 is configured to include eight partitions, and each memory stack 512 is configured to include two different sets of eight partitions each, whereby alternating memory chips 518 within the memory stack 512 are associated with an alternating set of eight partitions.

Memory interface 540 advantageously reduces the number of input/output pins required within processor 510 to access a given set of memory devices for a given interface bandwidth. In one embodiment, each signal within GRS link 514 is configured to transmit data at 20 Gbps. By contrast, conventional memory interfaces are only able to operate each signal at a bit rate of 1 Gbs to 2 Gbs. Therefore, to achieve comparable bandwidth, a conventional memory interface may require approximately ten to twenty times the number of signal pins compared to GRS link 514.

Figure 5D:
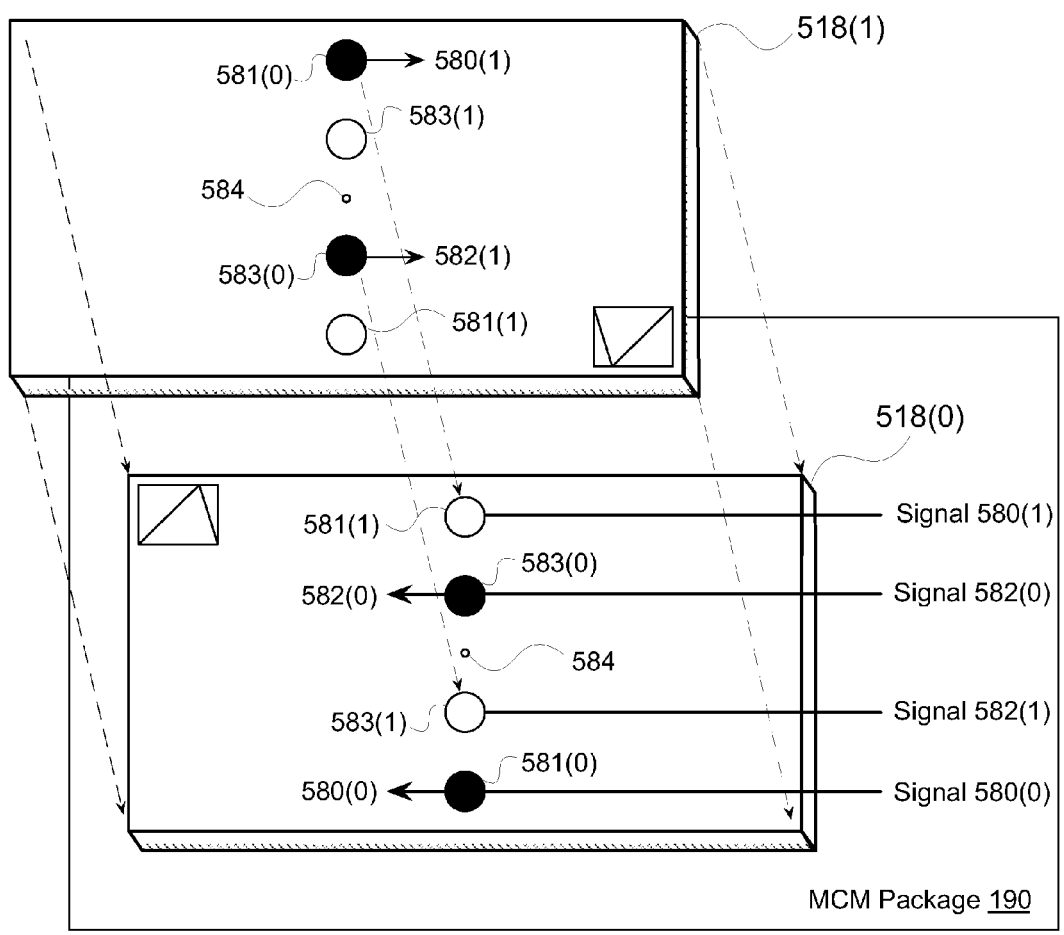
FIG. 5D illustrates an exemplary technique for organizing memory chip signals for stacking, in accordance with one embodiment.

FIG. 5D illustrates an exemplary technique for organizing memory chip signals for stacking, in accordance with one embodiment. As shown, memory chip 518(0) is coupled to MCM package 190 and memory chip 518(1) is coupled to memory chip 518(0) in a vertical stack configuration. Through-die vias 581, 583 provide electrical connections from bonding pads (not shown) on MCM package 190 through memory chip 518(1). Additional memory chips stacked above memory chip 518(1) may be similarly connected. Through-die vias 581, 583 drawn herein as open circles act as pass-through connections and should otherwise not be connected to circuitry on a given memory chip 518, while through-die vias drawn as filled circles are connected to circuitry on the memory chip. As shown, memory chip 518(1) is oriented one-hundred and eighty degrees about a center of rotation 584 with respect to memory chip 518(0). This rotation allows memory chip 518(0) to connect to a different set of signals than memory chip 518(1), while also allowing memory chip 518(0) to pass-through all required signals needed for memory chip 518(1).

As shown, each identical memory chip 518 requires a signal 580 and a signal 582. In the exemplary system configuration shown herein, memory chip 518(0) requires signals 580(0) and 582(0), while memory chip 518(1) requires signals 580(1) and 582(1). Signal 580(0) within MCM package 190 is coupled to circuitry within memory chip 518(0), but passes-through memory chip 518(1). Similarly, signal 580(1) passes through memory chip 518(0) but is coupled to circuitry within memory chip 518(1).

One or more addition pairs of memory chips 518 may be further stacked above memory chip 518(1), whereby the memory chips 518 within each additional pair are oriented according to memory chip 518(0) and 518(1). Each memory chip 518 within an arbitrary pair oriented according to memory chip 518(0) will be coupled to signals 580(0) and 582(0), while each memory chip 518 oriented according to memory chip 518(1) will be coupled to signals 580(1) and 582(1).

The above example illustrates a scenario whereby two signals are distributed from MCM package 190 to each substantially identical memory chip 518(0), 518(1), however persons skilled in the art will understand that the disclosed technique may be applied to an arbitrary number of signals and an arbitrary number of memory chips. More generally, the technique may be applied to provide differentiated signal distribution to any technically feasible stack of chips, each configured to implement an arbitrary function.

In configurations having two or more pairs of stacked chips, each chip may be required to have a unique identification number within the stack in order to properly respond to control commands. Any technically feasible technique may be implemented to establish a unique identification number for each chip, or, alternatively, a unique pair number for each chip. In one embodiment, each memory chip 518 includes a through-die via for receiving an inbound identification signal and a bonding pad for transmitting an outbound identification signal. The bonding pad is configured to align with the through-die via in a one-hundred eighty degree orientation. In this way, memory chip 518(0) may receive an inbound identification signal from MCM package 190, such as from processor 510. Memory chip 518(0) may then transmit an outbound identification signal through the bonding pad, coupled to a through-die via within memory chip 518(1). This identification signal becomes an inbound identification signal within memory chip 518(1). Each chip within an arbitrary stack of chips may be identified using this technique, enabling a command transmitted via a shared physical signal, such as parallel GRS channel 572, to target only an identified target chip.

As described above, each memory chip 518 within a memory stack 512 may be substantially identical. This represents an advantage over certain prior art stacking solutions that require two or more different versions of a stacked memory chip. Such different versions may include mirrored or "odd" and "even" versions for stacking.

Figure 5E:
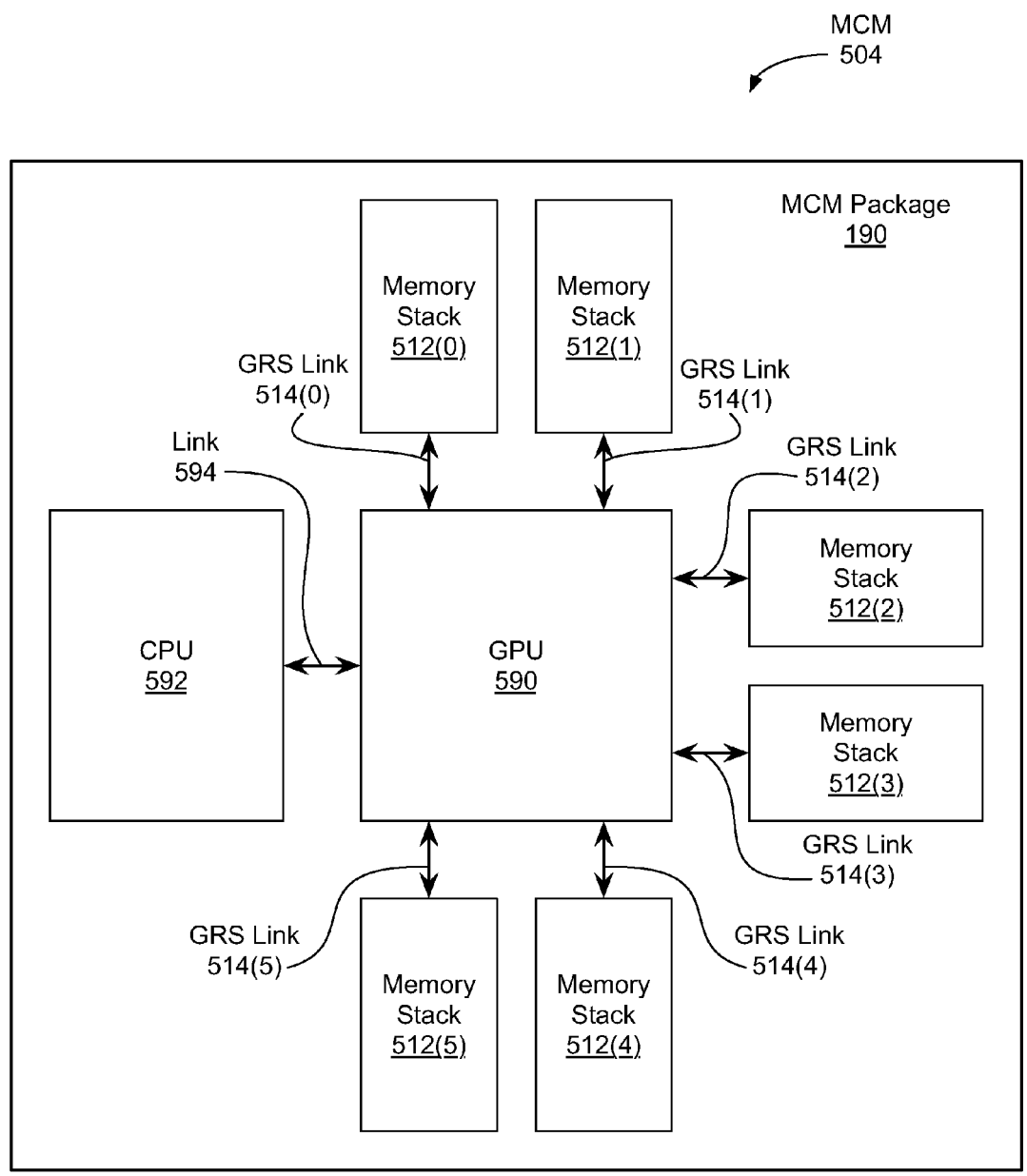
FIG. 5E illustrates a multi-chip module comprising a central processing unit, a graphics processing unit, and at least one memory stack coupled to a multi-chip module package, in accordance with one embodiment.

FIG. 5E illustrates an MCM 504 comprising a central processing unit (CPU) 592, a graphics processing unit (GPU) 590, and at least one memory stack 512 coupled to MCM package 190 of FIG. 1A, in accordance with one embodiment. As shown, GPU 590 is coupled to the at least one memory stack 512 via a corresponding GRS link 514. Each GRS link 514 comprises at least one GRS signal. For example GRS link 514(0) may include GRS signals configured to transmit data from GPU 590 to memory stack 512(0), and other GRS signals configured to transmit data from memory stack 512(0) to GPU 590. GRS link 514(0) may include GRS signals configured to transmit address and control information separately from other GRS signals configured to carry either read data or write data.

A link 594 is configured to interconnect CPU 592 and GPU 590. In one embodiment link 594 comprises GRS signals configured to transmit data, such as memory data, between CPU 592 and GPU 590. GPU 592 may be configured to access data within memory stacks 512 via GPU 590. In alternative embodiments, CPU 592 is also coupled to one or more memory stacks (not shown).

In one embodiment, at least one memory stack 512 comprises a DRAM device. In another embodiment, at least one memory stack 512 comprises a SRAM device. In yet another embodiment, at least one memory stack 512 comprises a spin-torque memory device, a phase-change memory device, a memristor memory device, or a FLASH memory device. In certain embodiments, one memory stack 512 comprises volatile memory devices, such as DRAM devices, while another memory stack 512 comprises non-volatile memory devices such as spin-torque memory devices or FLASH memory devices.

Figure 6:
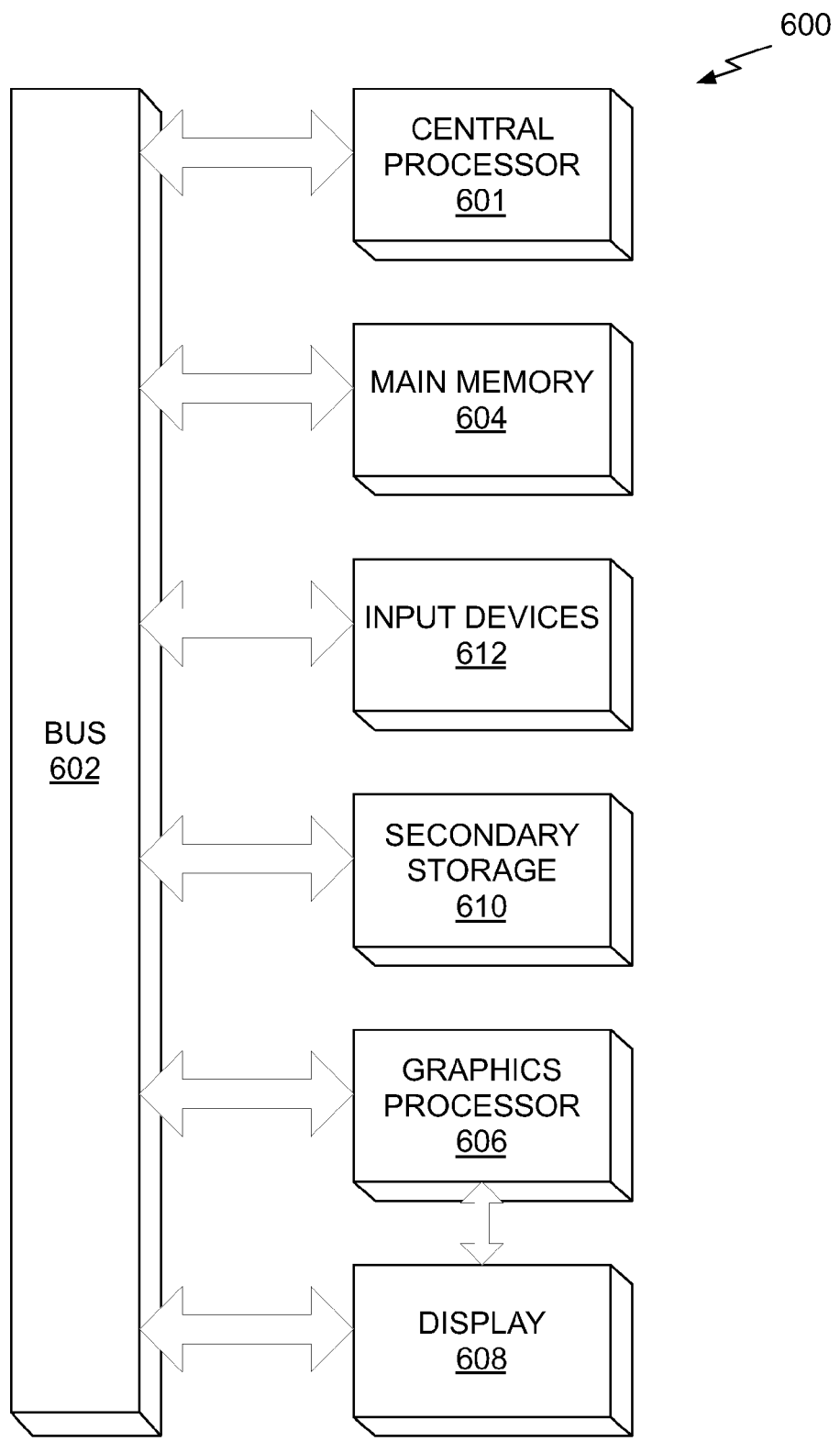
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 604 and/or the secondary storage 610. Such computer programs, when executed, enable the system 600 to perform various functions. The main memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

In one embodiment, certain signals within bus 602 are implemented as GRS signals, as described above in FIGS. 1A-3. In one embodiment, central processor 601 is implemented as processor 510 of FIG. 5A, and at least a portion of main memory 604 is implemented as one or more memory stack 512. In another embodiment, graphics processor 606 is implemented as processor 510, and related GPU memory is implemented as one or more memory stack 512. In yet another embodiment central processor 601, graphics processor 606, and main memory 604 are implemented as CPU 592, GPU 590, and memory stacks 512, respectively.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
a first processing unit configured to include a first ground-referenced single-ended signaling (GRS) interface circuit, wherein the first GRS interface circuit is configured to include a unidirectional transmitter circuit and a bidirectional transceiver circuit;
a memory subsystem configured to include a second GRS interface circuit; and
a package configured to include one or more electrical traces that couple the first GRS interface to the second GRS interface,
wherein the first GRS interface circuit and the second GRS interface circuit are each configured to transmit a pulse along one trace of the one or more electrical traces, and
wherein the bidirectional transceiver circuit is configured to transmit write data via GRS signals coupled to the one or more electrical traces by serializing data from an on-chip write bus to generate corresponding GRS signals for transmission via the one or more electrical traces.

2. The system of claim 1, wherein the pulse is transmitted by discharging a capacitor between the one trace and a ground network.

3. The system of claim 2, wherein a positively charged node on the capacitor is coupled to the one trace and a negatively charged node on the capacitor is coupled to the ground network to generate a pulse representing a logical value of one.

4. The system of claim 2, wherein a negatively charged node on the capacitor is coupled to the one trace and a positively charged node on the capacitor is coupled to the ground network to generate a pulse representing a logical value of zero.

5. The system of claim 1, wherein the memory subsystem comprises a stack of memory chips fabricated to include two or more through-die vias.

6. The system of claim 5, wherein the two or more through-die vias are organized as pairs and a first through-die via associated with a first pair is configured to substantially overlap with a second through-die via of the first pair when rotated about a center of rotation by one-hundred and eighty degrees.

7. The system of claim 6, wherein the first through-die via is coupled to circuitry within a corresponding chip and the second through-die via is passed through the corresponding chip.

8. The system of claim 1, wherein the memory subsystem comprises a plurality of partitions, and each partition within the plurality of partitions is configured to include an independent communications link within the one or more electrical traces.

9. The system of claim 1, wherein the memory subsystem comprises a stack of memory chips, and each one of the memory chips is associated with one of two sets of partitions.

10. The system of claim 1, wherein the unidirectional transmitter is configured to serialize a command field, a bank address field, a row address field, and a column address field.

11. A system, comprising:
a first processing unit configured to include a first ground-referenced single-ended signaling (GRS) interface circuit configured to include a unidirectional transmitter circuit and a bidirectional transceiver circuit including;
a memory subsystem configured to include a second GRS interface circuit; and a package configured to include one or more electrical traces that couple the first GRS interface to the second GRS interface, wherein the first GRS interface circuit and the second GRS interface circuit are each configured to transmit a pulse along one trace of the one or more electrical traces, and wherein the bidirectional transceiver circuit is configured to receive read data via GRS signals coupled to the one or more electrical traces by deserializing data arriving from the one or more electrical traces to generate corresponding data for transmission via an on-chip read data bus.

12. The system of claim 1, wherein the memory subsystem comprises dynamic random access memory (DRAM).

13. The system of claim 1, further comprising a second processing unit coupled to the first processing unit via a processor interface.

14. The system of claim 13, wherein the first processing unit comprises a graphics processing unit and the second processing unit comprises a central processing unit.

15. The system of claim 13, wherein the processor interface comprises a third GRS interface circuit.

16. The system of claim 1, wherein the package comprises an organic substrate.

17. The system of claim 1, wherein the package includes a silicon substrate.

18. The system of claim 11, wherein the pulse is transmitted by discharging a capacitor between the one trace and a ground network.

19. The system of claim 11, wherein the memory subsystem comprises a stack of memory chips fabricated to include two or more through-die vias.

20. The system of claim 11, wherein the memory subsystem comprises a plurality of partitions, and each partition within the plurality of partitions is configured to include an independent communications link within the one or more electrical traces.

* * * * *